(12) United States Patent
Xiong et al.

(10) Patent No.: US 8,383,438 B2
(45) Date of Patent: Feb. 26, 2013

(54) METHOD FOR FABRICATING INGAAIN LIGHT-EMITTING DIODES WITH A METAL SUBSTRATE

(75) Inventors: Chuanbing Xiong, Jiangxi (CN); Fengyi Jiang, Jiangxi (CN); Li Wang, Jiangxi (CN); Wenqing Fang, Jiangxi (CN); Guping Wang, Jiangxi (CN); Shaohua Zhang, Jiangxi (CN)

(73) Assignee: Lattice Power (JIANGXI) Corporation, Nanchang (CN)

( * ) Notice: Subject to any disclaimer, the term of this patent is extended or adjusted under 35 U.S.C. 154(b) by 40 days.

(21) Appl. No.: 13/059,140

(22) PCT Filed: Aug. 19, 2008

(86) PCT No.: PCT/CN2008/001493
§ 371 (c)(1),
(2), (4) Date: Feb. 15, 2011

(87) PCT Pub. No.: WO2010/020069
PCT Pub. Date: Feb. 25, 2010

(65) Prior Publication Data
US 2011/0140080 A1    Jun. 16, 2011

(51) Int. Cl.
*H01L 21/00* (2006.01)
*H01L 29/06* (2006.01)
(52) U.S. Cl. ............ 438/39; 438/46; 438/604; 257/622; 257/762

(58) Field of Classification Search .................. None
See application file for complete search history.

(56) References Cited

U.S. PATENT DOCUMENTS

| 6,583,443 | B1* | 6/2003 | Chang et al. | 257/79 |
| 2003/0218179 | A1* | 11/2003 | Koide et al. | 257/95 |
| 2004/0256631 | A1 | 12/2004 | Shin | |
| 2006/0157714 | A1 | 7/2006 | Yoo | |
| 2008/0265265 | A1* | 10/2008 | Xiong et al. | 257/97 |

FOREIGN PATENT DOCUMENTS
WO    2007048346 A1    5/2007

* cited by examiner

*Primary Examiner* — Alonzo Chambliss
(74) *Attorney, Agent, or Firm* — Shun Yao; Park, Vaughan, Fleming & Dowler LLP

(57) ABSTRACT

One embodiment of the present invention provides a method for fabricating light-emitting diodes. The method includes etching grooves on a growth substrate, thereby creating mesas on the growth substrate. The method further includes fabricating on each of the mesas an indium gallium aluminum nitride (InGaAlN) multilayer structure which contains a p-type layer, a multi-quantum-well layer, and an n-type layer. In addition, the method includes depositing one or more metal substrate layers on top of the InGaAlN multilayer structure. Moreover, the method includes removing the growth substrate. Furthermore, the method includes creating electrodes on both sides of the InGaAlN multilayer structure, thereby resulting in a vertical-electrode configuration.

16 Claims, 7 Drawing Sheets

METHOD FOR FABRICATING INGAAIN LIGHT-EMITTING DIODES WITH A METAL SUBSTRATE

BACKGROUND

1. Field of the Invention

The present invention relates to the manufacturing of light-emitting diodes. More specifically, the present invention relates to a technique for fabricating indium gallium aluminum nitride (InGaAlN) semiconductor material on a silicon substrate and transferring such material onto a metal substrate.

2. Related Art

Light-emitting diodes (LEDs) fabricated with InGaAlN semiconductor material have been widely used in large screen displays, traffic lights, lighting sources for backlighting, solid state lighting devices, and so on. Typically, an InGaAlN multilayer structure is epitaxially fabricated on a sapphire or SiC substrate, and electrodes are often placed on the same side of the structure.

A number of methods have been developed to manufacture LEDs. However, InGaAlN LEDs fabricated with these methods typically have low luminance efficiency and low thermal conductivity. This is because a translucent conductive layer can absorb light emitted from the active region. In addition, the same-side electrode configuration often leads to low utilization of a device's surface area.

Alternatively, the device can have a vertical-electrode configuration, wherein one electrode is placed above the epitaxial structure and another electrode is placed on the backside of a conductive substrate (such as a Si substrate). However, with the vertical-electrode configuration, the light absorption problem in the non-translucent substrate and the ohmic contact layer remains. Furthermore, the vertical-electrode configuration can increase the turn-on voltage of the LEDs because of the presence of an aluminum nitride (AlN) buffer layer.

One method for fabricating InGaAlN LEDs employs wafer bonding in conjunction with wet etching techniques. In this method, an InGaAlN multilayer structure is fabricated on a silicon growth substrate. Then the InGaAlN structure and a conductive substrate are pressure-welded at a metal bonding layer. Next, the silicon growth substrate is removed by wet etching, and the InGaAlN structure is thus transferred onto the conductive substrate. This flip-chip fabrication technique allows the device structure to use a vertical-electrode configuration, in which the two electrodes are on both sides of the device. Consequently, the LEDs can have higher luminance efficiency, lower turn-on voltage, and higher surface-area utilization, compared with those fabricated using the other conventional methods. However, during the pressure-welding process, the InGaAlN structure and the conductive substrate are exposed to relatively high pressure and high temperature, which can reduce the reliability of the LEDs. Therefore, the stability of the pressure-welding process is a major concern for this method.

Although sapphire can also be used as a growth-substrate material, a sapphire substrate is more expensive and more difficult to process than a silicon substrate. Therefore, InGaAlN LEDs fabricated on a silicon substrate have higher commercial values.

SUMMARY

One embodiment of the present invention provides a method for fabricating light-emitting diodes. The method includes etching grooves on a growth substrate, thereby creating mesas on the growth substrate. The method further includes fabricating on each of the mesas an indium gallium aluminum nitride (InGaAlN) multilayer structure which contains a p-type layer, a multi-quantum-well layer, and an n-type layer. In addition, the method includes depositing one or more metal substrate layers on top of the InGaAlN multilayer structure. Moreover, the method includes removing the growth substrate. Furthermore, the method includes creating electrodes on both sides of the InGaAlN multilayer structure, thereby resulting in a vertical-electrode configuration.

In a variation of this embodiment, fabricating the InGaAlN multilayer structure includes using metalorganic chemical vapor deposition.

In a variation of this embodiment, depositing the one or more metal substrate layers further includes fabricating an ohmic contact layer; annealing the InGaAlN multilayer structure with the ohmic contact layer; and forming a corrosion protection layer.

In a further variation, the ohmic contact layer is composed of an alloy based on platinum-aurum, platinum-rhodium, nickel-aurum oxide, or indium-tin oxide.

In a further variation, the ohmic contact layer is composed of translucent material based on nickel-aurum oxide, indium-tin oxide, or a combination of nickel-aurum oxide and indium-tin oxide.

In a further variation, the corrosion protection layer is composed of aurum, platinum, palladium, rhodium, or stainless steel.

In a variation of this embodiment, the metal substrate layers are of different materials suitable for selective etching.

In a further variation, the metal substrate layers include a silver layer sandwiched between two copper layers.

In a variation of this embodiment, removing the growth substrate comprises chemical etching.

In a variation of this embodiment, the method further includes roughening the surface of the n-type layer.

BRIEF DESCRIPTION OF THE FIGURES

The drawings accompanying and forming part of this specification are included to depict certain aspects of the invention. The invention may be better understood by reference to one or more of these drawings in combination with the description presented herein. It should be noted that the features illustrated in the drawings are not necessarily drawn to scale.

FIG. 3C-1 is a cross-section view of LEDs with a multi-layer metal substrate and a protective layer fabricated on a corrosion protection layer in accordance with one embodiment of the present invention.

FIG. 3C-2 is a cross-section view of LEDs with a one-layer metal substrate and a protective layer fabricated on a corrosion protection layer in accordance with one embodiment of the present invention.

FIG. 3G-1 is a cross-section view of LEDs with an electrode deposited in a void that penetrates an AlN buffer layer in accordance with one embodiment of the present invention.

FIG. 3G-2 is a cross-section view of LEDs with an electrode deposited in a void that penetrates an AlN buffer layer and a roughened n-type GaN layer in accordance with one embodiment of the present invention.

FIG. 3G-3 is a cross-section view of LEDs with an electrode deposited on a roughened AlN buffer layer and n-type layer in accordance with one embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the present invention. Thus, the present invention is not limited to the embodiments shown, but is to be accorded the widest scope consistent with the claims.

Overview

Embodiments of the present invention provide a method for fabricating InGaAlN-based LEDs with a vertical electrode configuration and a metal substrate. In one embodiment, after an InGaAlN multilayer structure is fabricated on a silicon growth substrate, which is patterned with grooves, the multilayer structure is transferred from the silicon growth substrate onto a conductive metal substrate. In one embodiment, a metal substrate of a predetermined thickness is deposited on the InGaAlN multilayer structure using electric plating, ion plating or magnetron sputtering. The silicon substrate is subsequently removed using chemical etching. In addition, electrodes are deposited on both sides of the LED structure.

Figure 1:
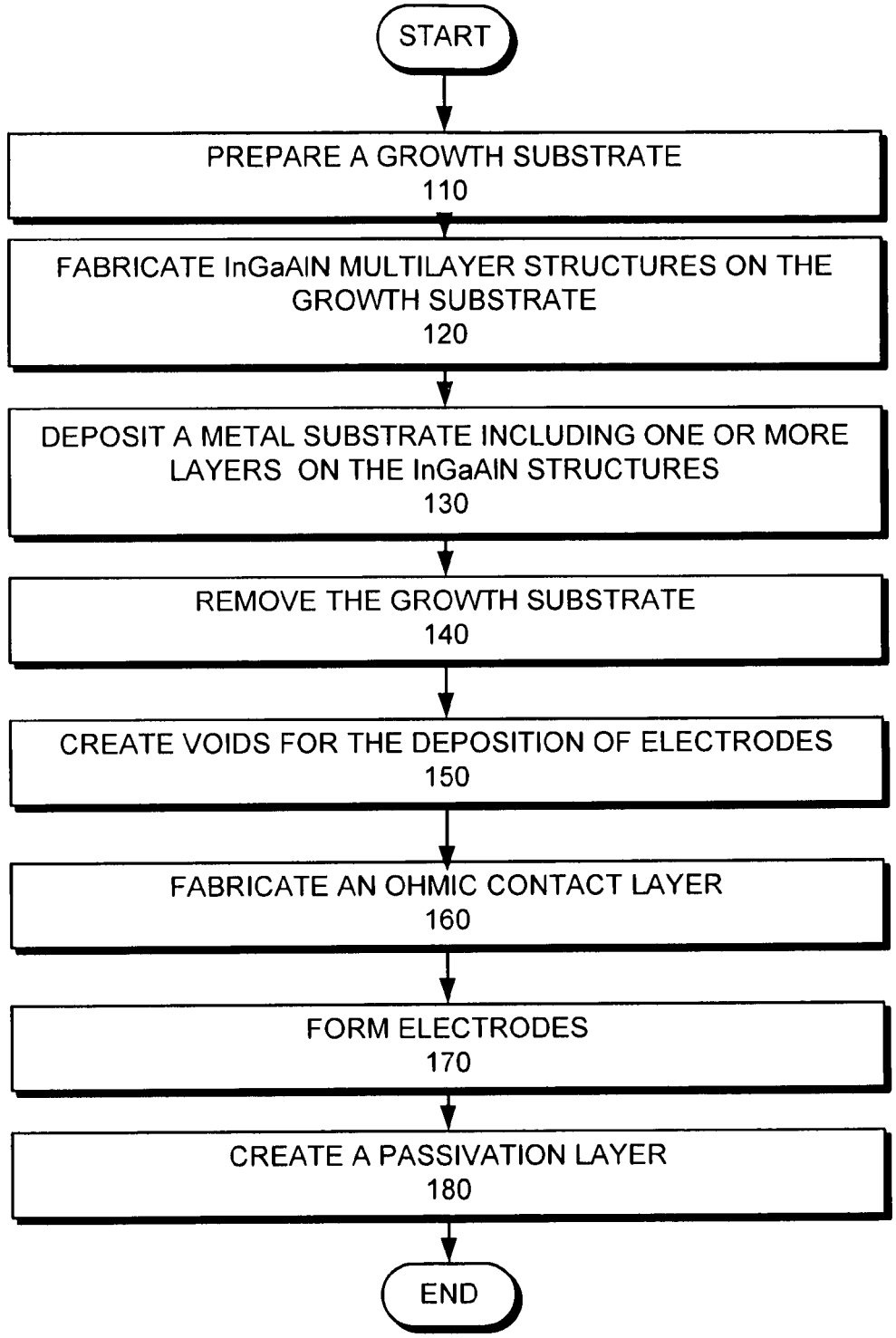
FIG. 1 is a flow diagram illustrating a method for fabricating LEDs in accordance with one embodiment of the present invention.

FIG. 1 is a flow diagram illustrating a method for fabricating LEDs in accordance with the present invention. During the fabrication process, a growth substrate, which in one embodiment can be a Si substrate, is prepared (operation 110). In one embodiment, grooves are etched on the growth substrate, so that individual mesas are formed. These mesas allow InGaAlN multilayer structures to be fabricated without cracking due to lattice-constant and thermal-expansion-coefficient mismatch. Subsequently, an InGaAlN structure is fabricated on the patterned structures (operation 120).

Next, a metal substrate comprising one or more metal layers is deposited above the InGaAlN multilayer structure (operation 130). The device is then submerged in a wet etchant to remove the growth substrate (operation 140). After the growth substrate is removed, the device is flipped upside down, and a void is optionally created through its buffer layer so that an electrode can be fabricated in contact with the conductive p-type or n-type layer of the device (operation 150).

Subsequently, an ohmic contact layer is fabricated (operation 160). In addition, electrodes are formed on both sides of the device (operation 170). In one embodiment, a passivation layer is created to protect the device (operation 180).

Figure 2:
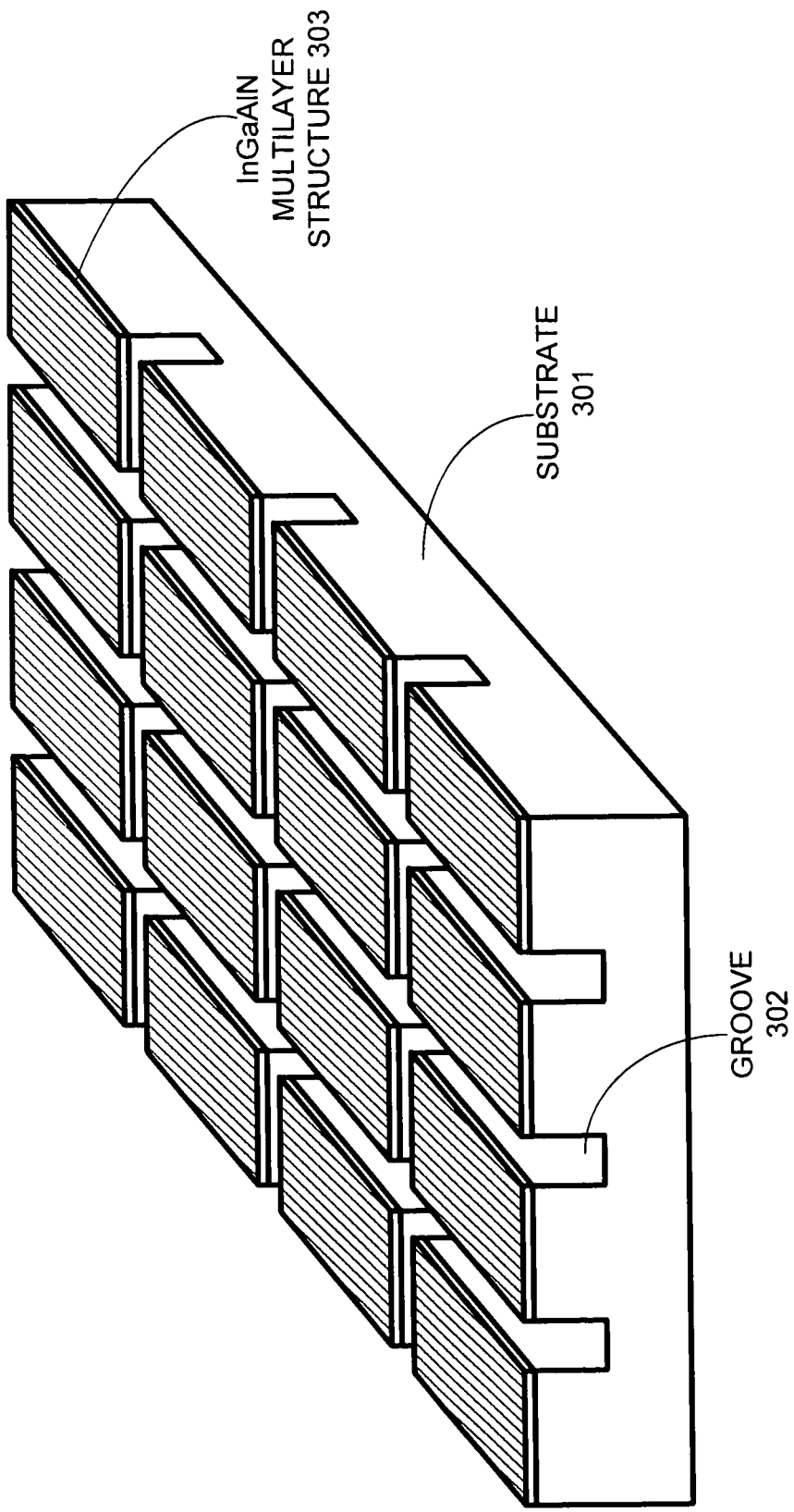
FIG. 2 is a wafer-level view of InGaAlN structures fabricated on a growth substrate in accordance with one embodiment of the present invention.

FIG. 2 is a wafer-level view of an InGaAlN structure fabricated on a growth substrate in accordance with one embodiment of the present invention. FIGS. 3A-3H are supplemental drawings that help illustrate the method described in FIG. 1.

Figure 3A:
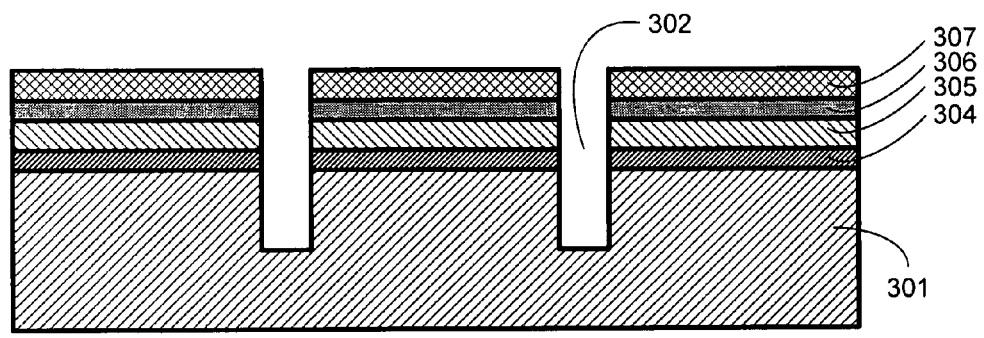
FIG. 3A is a cross-section view of LEDs fabricated on a growth substrate in accordance with one embodiment of the present invention.

Referring to FIG. 3A and operation 110 in FIG. 1, an InGaAlN multilayer structure 303 is fabricated on one of the mesas created by grooves 302 etched on a growth substrate layer 301. In one embodiment, metalorganic chemical vapor deposition (MOCVD) is used to fabricate InGaAlN structure 303.

Grooves 302 divide growth substrate layer 301 into rectangular mesas. The depth of grooves 302 is ideally larger than 3 microns, and the width is ideally between 3 and 100 microns. Depending on how grooves are etched, the shape of a mesa may be a square, rectangle, diamond, triangle, and so forth. In addition, the area of a mesa can be larger than 100 square microns. The typical sizes of a mesa are 200×200 µm2, 300×300 µm2, and 400×400 µm2.

With reference to FIG. 3A, in one embodiment, InGaAlN structure 303 comprises an aluminum nitride (AlN) buffer layer 304, which is fabricated above silicon growth substrate 301, an n-type gallium nitride (GaN) layer 305, an indium gallium nitride (InGaN)/GaN multi-quantum-well layer 306, and a p-type GaN layer 307. In addition, an InGaN overlay layer with a thickness of about 2 nanometers may be deposited on top of p-type layer 307. The InGaN overlay layer may or may not be doped with magnesium, and can be treated as part of p-type layer 307. The tension created by the 2-nanometer-thick InGaAlN overlay layer changes the polarization field on the surface of p-type GaN layer 307 and thus increases the concentration of hole carriers, thereby improving the quality of an ohmic contact layer.

In one embodiment, AlN buffer layer 304 can be replaced with alternating layers of AlN and GaN. The GaN in a buffer layer may be in compliance with the stoichiometry ratio. The dopant for n-type layer 305 can be silicon, and for p-type layer 307 magnesium. It is optional to dope multi-quantum-well layer 306 with impurity.

Figure 3B:
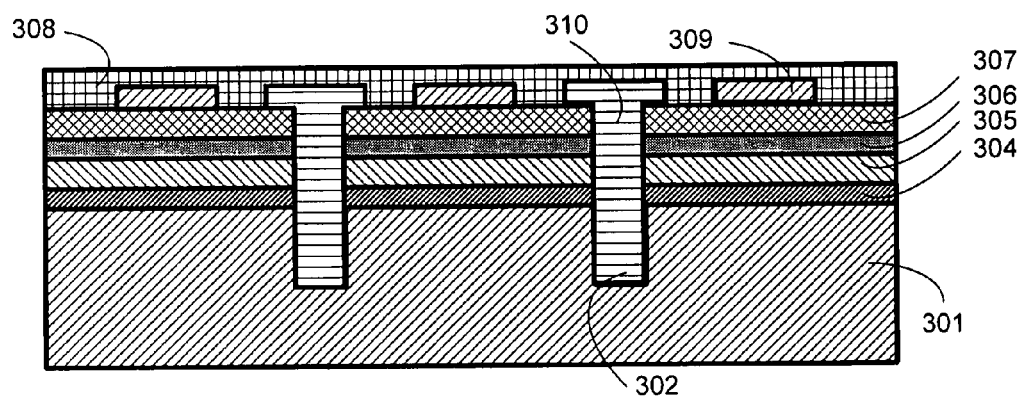
FIG. 3B is a cross-section view of LEDs with an ohmic contact layer and a corrosion protective layer fabricated on top of a p-type layer in accordance with one embodiment of the present invention.

Referring to FIG. 3B and operation 120 in FIG. 1, an ohmic contact layer 309 is fabricated on top of p-type layer 307 of InGaAlN structure 303. After the fabrication of ohmic contact layer 309, grooves 302 are filled with filling 310. Subsequently, a corrosion protection layer 308 is deposited on top of p-type layer 307.

The materials used to fabricate ohmic contact layer 309 can be alloys of platinum-aurum, platinum-rhodium, nickel-aurum oxide, indium-tin oxide, etc. Ohmic contact layer 309 may be replaced with alternating layers of the following materials: platinum and aurum; platinum and rhodium; platinum, rhodium and aurum; or ternary alloys of platinum, rhodium, and aurum. In one embodiment, the dimension of ohmic contact layer 309 is smaller than that of the dimension of InGaAlN structure 303 fabricated on a mesa.

In order to activate the dopant in n-type layer 305, InGaAlN structure 303 is annealed in a reactor chamber at approximately 760° C. Afterwards, ohmic contact layer 309 is deposited using an evaporation plating process. Alternatively, an ohmic contact layer of platinum, for example, can be deposited on InGaAlN structure 303. Then platinum-coated InGaAlN structure 303 is annealed in a reactor chamber at approximately 550° C. for about 10 minutes. The ratio between carrier gases N2 and O2 is 4 to 1 . The platinum ohmic contact layer, with a thickness between 10 and 10,000 Å, absorbs hydrogen atoms, which has a passivating effect on magnesium.

To avoid the current-crowding effect between p-type and n-type electrodes, a small region that is not covered by the ohmic contact layer can be created on the p-type layer using photolithography. This small region prevents the light emitted from the multi-quantum-well layer from being blocked by the n-type electrode.

The ohmic contact layer adjacent to the p-type layer can be made translucent, and an additional reflective layer can be deposited on the translucent ohmic contact layer in order to improve the light extraction efficiency of the LEDs. In one embodiment, the thickness of the translucent ohmic contact layer fabricated using the metals described above is smaller than 200 Å. Alternatively, the translucent ohmic contact layer can be fabricated using oxides such as nickel-aurum oxide, indium-tin oxide, and a combination of nickel-aurum oxide and indium-tin oxide. In one embodiment, the thickness of the translucent ohmic contact layer fabricated using an oxide is about 200Å.

The light reflective layer can be made of silver, aluminum, or any alloy with high reflectivity. An optional diffusion-barrier layer can be placed between the ohmic contact layer and the light reflective layer. The diffusion-barrier layer, made of titanium nitride, for example, has high transmissivity and is chemically and physically stable. As a result, it can effectively prevent the metal-based light reflective layer from damaging the ohmic contact layer.

An ohmic contact layer with a lattice-like pattern covers a smaller area of the p-type GaN layer than one with a continuous pattern. Therefore, the ohmic contact layer can have a lattice-like pattern in order to reduce the attenuation of light emitted from the multi-quantum-well layer. Similarly, the diffusion-barrier layer can also have a lattice-like pattern so that the light reflective layer is only in contact with the segments of the p-type GaN layer that is not covered by the ohmic contact layer.

Filling 310, which seals grooves 302, can be made of either non-conductive material (e.g., photoresist) or conductive material (e.g., metal). The deposition of corrosion protection layer 308 on InGaAlN structure 303 can be performed using electron beam evaporation, magnetron sputtering, or thermal resistance evaporation. Corrosion protection layer 308 protects the metal substrate and is conductive and tolerant to the corrosion of silicon etching solution. Corrosion protection layer 308 is made of either pure metal (e.g., aurum, platinum, palladium, and rhodium) or alloys (e.g., stainless steel alloy and alloys containing aurum, platinum, palladium or rhodium), which are tolerant to the corrosion of silicon etching solution. In one embodiment, corrosion protective layer 308 is deposited on InGaAlN structure 303 with sufficient density so that there is no gap in the layer.

Figures 1, 3C:
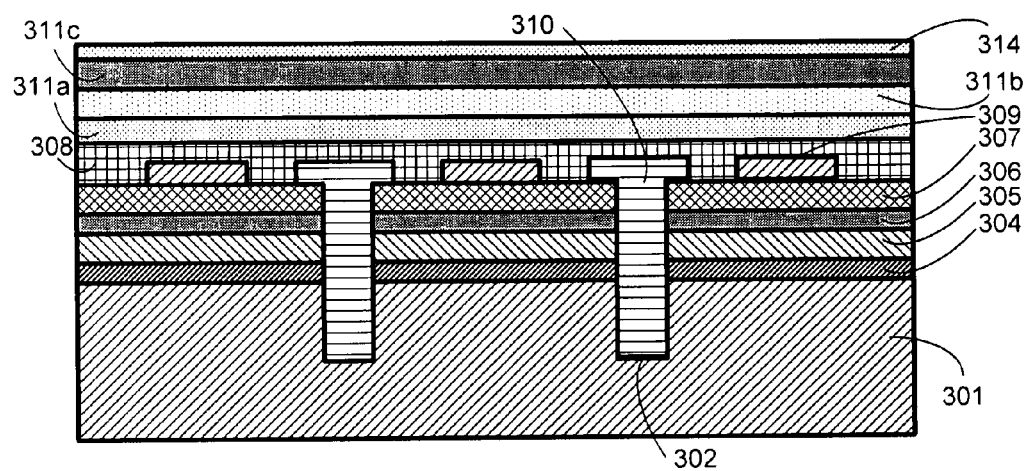
Figures 2, 3C:
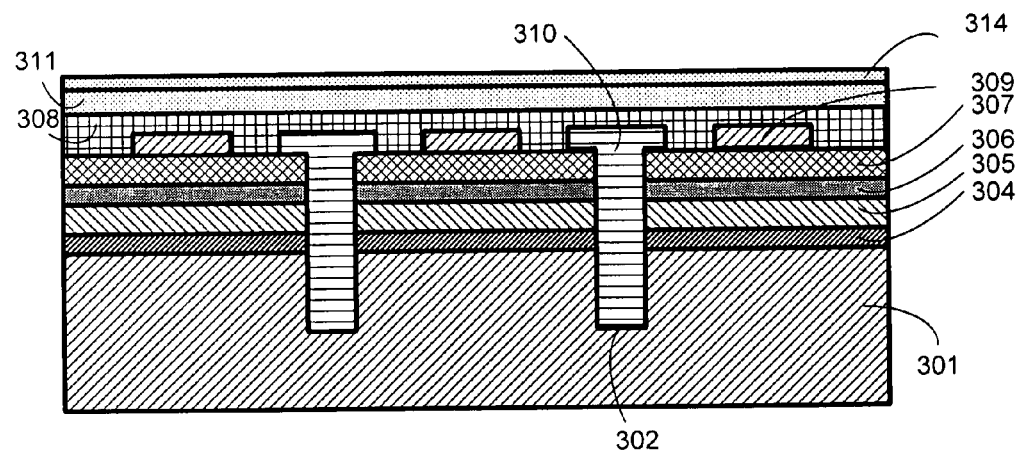

With reference to FIG. 3C-2 and operation 130 in FIG. 1, a metal substrate 311, made of pure metal or alloy, is fabricated on corrosion protection layer 308 using electroplating. Other dry deposition methods, such as magnetron sputtering, ion plating, electron beam evaporation, and thermal resistance evaporation, are also applicable. A metal substrate can include one or more layers. In one embodiment, as illustrated in FIG. 3C-1, a multilayer metal substrate includes a bottom layer 311a, a middle layer 311b, and a top layer 311c, which are fabricated on corrosion protection layer 308. In addition, a protective layer 314 is deposited on top of top layer 311c. Protective layer 314 can be made of a pure metal or an alloy that is resistant against a silicon etching solution.

In some embodiments, chemical etching is employed in dicing the metal substrate. If the metal substrate has multiple layers, it is essential that the constituents of the multilayer metal substrate be suitable for selective etching. In other words, the adjacent metal substrate layers are ideally made of metals that react differently to different chemical solutions. For example, a multilayer metal substrate can comprise layers of electroplated copper, silver, and copper. A silver/copper/silver structure is also applicable.

Figure 3D:
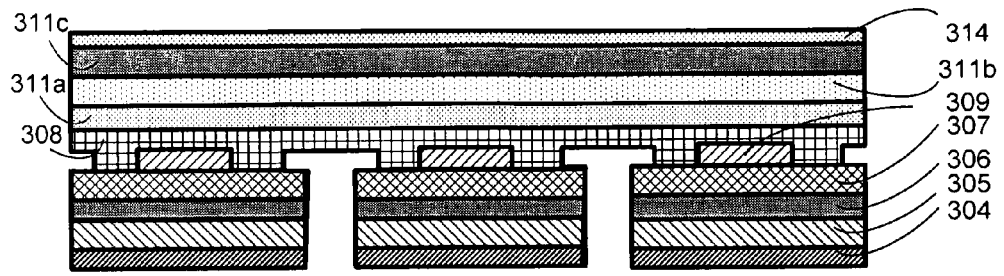
FIG. 3D is a cross-section view of LEDs with an InGaAlN multilayer structure transferred from a silicon substrate onto a metal substrate in accordance with one embodiment of the present invention.

With reference to FIG. 3D and operation 140 in FIG. 1, silicon substrate layer 301 is removed using chemical etching. InGaAlN structure 303 is thus transferred from Si (111) silicon substrate 301 onto metal substrate 311, which in some embodiments includes metal layers 311a, 311b, and 311c, as illustrated in FIG. 3D.

Typically, the silicon etching solution used to remove a silicon substrate is a mixture of nitrate acid, hydrofluoric acid and acetic acid, with a ratio of 5:2:2 . The process of chemical etching occurs at approximately 80° C. After the removal of silicon substrate layer 301, filling 310 in grooves 302 is removed using ultrasonic cleaning or other methods.

Figure 3E:
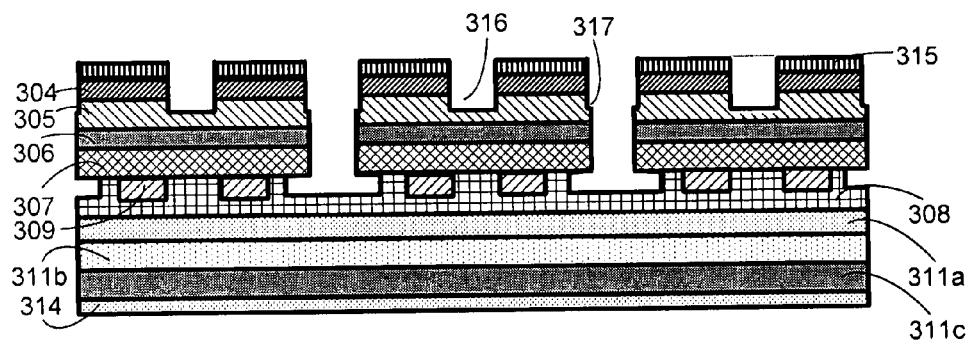
FIG. 3E is a cross-section view of LEDs with grooves etched on an InGaAlN structures in preparation for the deposition of electrodes in accordance with one embodiment of the present invention.

With reference to FIG. 3E and operation 150 in FIG. 1, a mask layer 315, made of photoresist, metal, or a combination of metal and photoresist, is coated on AlN buffer layer 304. Note that the LED structure shown in FIG. 3E is identical to one shown in FIG. 3D after it is rotated by 180°. In preparation for the deposition of electrodes, voids 316 are etched on InGaAlN structure 303 using inductively coupled plasma (ICP) etching. Voids 316 are where electrodes will be deposited; henceforward, they are referred to as electrode voids. It is optional to have the LED structure exposed to ultraviolet light during the etching process. Etching the voids can also be accomplished using reactive ion etching or wet etching. The gas used in the reactive ion etching process can be based on chlorine or other commonly used gases for etching GaN. The corrosive solution for wet etching can be phosphoric acid, sodium hydroxide or potassium hydroxide.

It is essential that electrode voids 316 not penetrate n-type GaN layer 305. After the etching of electrode voids 316, the edges of n-type GaN layer 305 are removed. An open space 317 represents an edge of n-type GaN layer 305 of the LED structure that has undergone the edge-removal process. Mask layer 315 is subsequently removed.

Figure 3F:
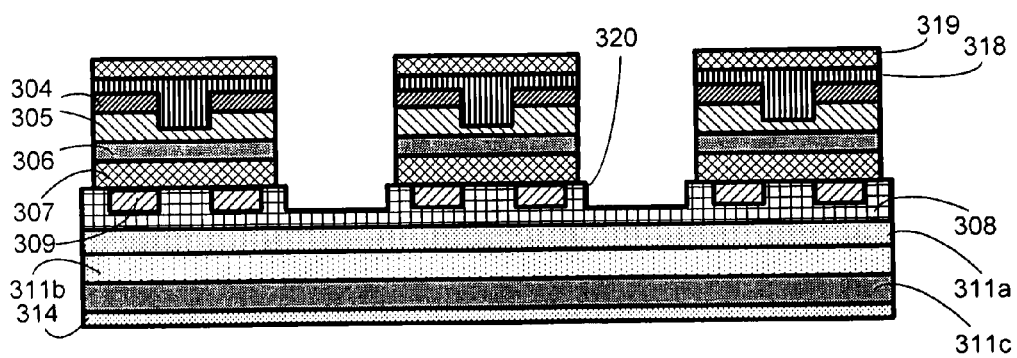
FIG. 3F is a cross-section view of LEDs with a segment of a corrosion protection layer exposed in accordance with one embodiment of the present invention.

With reference to FIG. 3F and operation 160 in FIG. 1, an ohmic contact metal layer 318 and a mask layer 319 made of photoresist are fabricated on top of AlN buffer layer 304. The materials used for ohmic contact metal layer 318 can include alloys of: germanium, nickel and aurum; aurum and silicon; titanium nitride; titanium and aluminum; and a combination of two or more materials selected from the group consisting of germanium-nickel-aurum, aurum-silicon, titanium nitride, and titanium-aluminum. Furthermore, an overlay layer, made of titanium-aurum or nickel-aurum, is deposited on top of ohmic contact metal layer 318 to facilitate wire bonding.

FIG. 3F is a cross-section view of LEDs with a segment of a corrosion protection layer exposed. To improve the quality of the LEDs, the edges of n-type GaN layer 305, InGaN/GaN multi-quantum-well layer 306, and p-type GaN layer 307 can be removed to mitigate the boundary effect in the device. In one embodiment, the edges are removed in such a way that a segment 320 of corrosion protection layer 308 is exposed. The technique used in edge removal can be dry etching, wet etching, or a combination of both.

Figures 1, 3G:
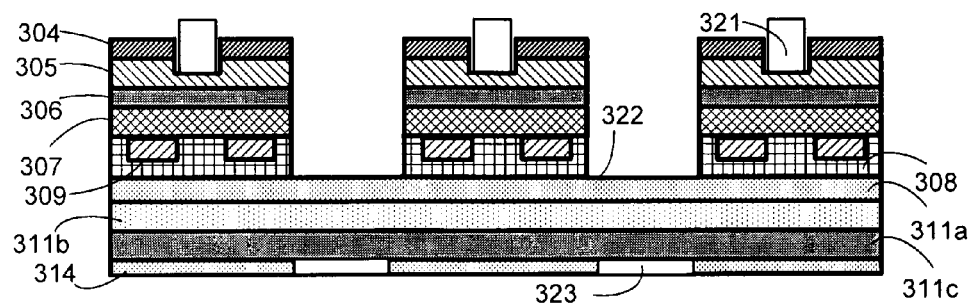
Figures 2, 3G:
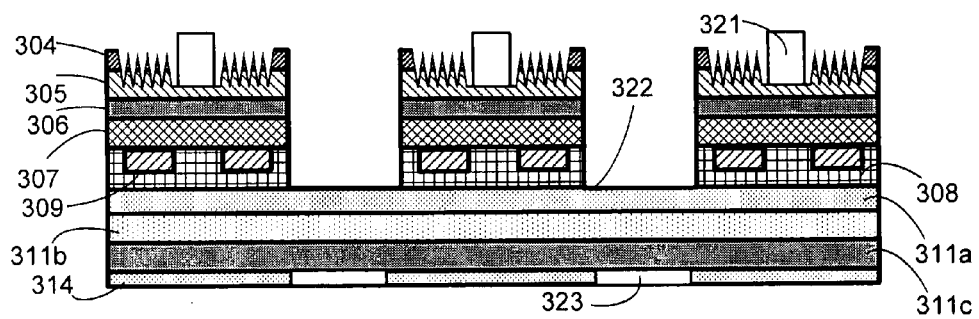

With reference to FIG. 3G-1 and operation 170 in FIG. 1, an electrode 321 is deposited in electrode voids 316. Exposed segment 320 of corrosion protection layer 308 is further etched, resulting in increased depth of grooves 322, the bottom of which is the surface of corrosion protection layer 308. Protective layer 314, which is beneath top layer 311c, is etched with grooves 323 in such a way that they are aligned with grooves 322. Corresponding grooves 322 and 323 facilitate the subsequent dicing of multilayer metal substrate 311 in the back-end processing.

As illustrated in FIG. 3G-2, the surface of n-type GaN layer 305 can be roughened to obtain a specific degree of roughness, if required. The pattern of a roughened surface can exhibit the shape of a hexagonal cone, hexagonal column, cylindrical, cone, or ring column. The roughening methods can include photoelectric chemical etching, ICP etching, or a combination of the two. If photoelectric chemical etching is used in the roughening process, the corrosive solution can be phosphoric acid, potassium hydroxide, or sodium hydroxide.

Figures 3, 3G:
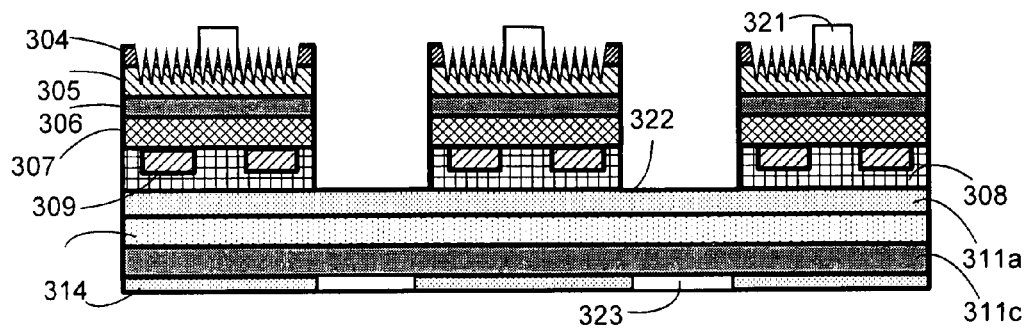

FIG. 3G-3 is a cross-section view of LEDs with an electrode deposited on a roughened AlN buffer layer and n-type layer in accordance with one embodiment of the present invention. As illustrated in this example, the roughening process creates a corrugated surface which exposes n-type layer 305. Electrode 321 can be deposited on the corrugated surface and still achieve an ohmic contact with n-type layer 305.

Figure 3H:
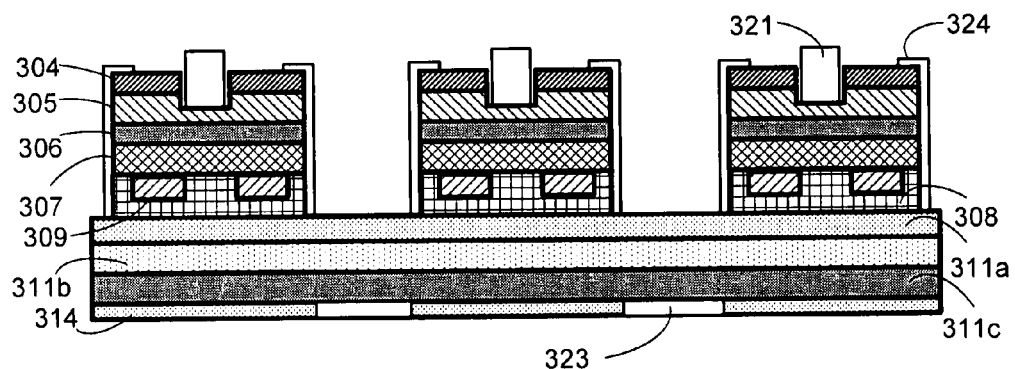
FIG. 3H is a cross-section view of LEDs with a passivation layer formed on the vertical sides of an InGaAlN multilayer structure in accordance with one embodiment of the present invention.

With reference to FIG. 3H and operation 180 in FIG. 1, a passivation layer 324 is formed on the vertical sidewalls of the LED structure. Passivation layer 324 can be made of silica, aluminum oxide, polyimide, silicon nitride, or two or more commonly used passivation materials. On completion of operation 180, the LEDs are fabricated and are ready for dicing, testing, packaging, and shipping.

EXAMPLE

An exemplary embodiment of the method disclosed in the present invention is described here in conjunction with the process in FIG. 1. In operation 110, a growth substrate is etched with diamond-shape grooves, resulting in mesas. The depth of grooves is approximately 5 microns and the width is approximately 50 microns. The area of each mesa is 50,000 μm2. An InGaAlN multilayer structure is fabricated on the growth substrate using MOCVD. The InGaAlN structure comprises a buffer layer which includes alternating layers of AlN and GaN, an n-type GaN layer doped with silicon, an InGaN/GaN multi-quantum-well layer, and a p-type GaN layer doped with magnesium.

In operation 120, an ohmic contact layer made of platinum-aurum alloy is deposited on the p-type layer using evaporation plating. The thickness of the ohmic contact layer is approximately 5,000 Å. The alloy-coated InGaAlN structure is annealed in a reactor chamber at approximately 550° C. for about 10 minutes. The ratio between carrier gases N2 and O2 is 4 to 1. The etched grooves are then filled with filling made of metal, and a corrosion protection layer made of aurum is deposited on the InGaAlN structure using electron beam evaporation.

In operation 130, three metal substrate layers, which include electroplated copper, silver, and copper layers, are fabricated on the corrosion protection layer using electroplating. In addition, a metal protective layer is deposited on top of the three metal substrate layers.

In operation 140, the silicon growth substrate is removed using a silicon etching solution, which is a mixture of nitrate acid, hydrofluoric acid and acetic acid, with a ratio of 5:2:2. The process of chemical etching occurs at approximately 80° C. Subsequently, the filling is removed using ultrasonic cleaning.

In operation 150, the electrode voids are etched on the InGaAlN structure using wet etching. The corrosive solution for wet etching is phosphoric acid.

In operation 160, an ohmic contact layer made of aurum and silicon is fabricated, and an overlay layer, made of titanium-aurum or nickel-aurum, is deposited on top of the ohmic contact metal layer to facilitate wire bonding.

In operation 170, the surface of the n-type GaN layer, except where an n-type electrode is formed, is roughened. The pattern of the roughened surface exhibits a shape of a hexagonal cone. The corrosive solution used in photoelectric chemical etching is phosphoric acid. An electrode is then formed on top of n-type GaN layer. In operation 180, a passivation layer, made of aluminum oxide, is formed on the vertical sidewalls of the LEDs. On completion of operation 180, LEDs are fabricated.

The invention is illustrated with different embodiments, described in detail, and with examples for purposes of facilitating the implementation of the different features or components of the invention. However, it is not the intent of the inventors to limit the application of the invention to the details shown. Modification of the features or components of the invention can be made without deviating from the spirit of the invention and thus still remains within the scope of the appended claims.

What is claimed is:

1. A method for fabricating light-emitting diodes, the method comprising:
    etching grooves on a growth substrate, thereby creating mesas on the growth substrate;
    fabricating on each of the mesas an indium gallium aluminum nitride (InGaAlN) multilayer structure comprising a p-type layer, a multi-quantum-well layer, and an n-type layer;
    depositing one or more metal substrate layers on top of the InGaAlN multilayer structure, wherein the metal substrate layers comprise a silver layer sandwiched between two copper layers;
    removing the growth substrate; and
    creating electrodes on both sides of the InGaAlN multilayer structure, thereby resulting in a vertical-electrode configuration.

2. The method of claim 1, wherein fabricating the InGaAlN multilayer structure comprises using metalorganic chemical vapor deposition.

3. The method of claim 1, wherein depositing the one or more metal substrate layers further comprises:
    fabricating an ohmic contact layer;
    annealing the InGaAlN multilayer structure with the ohmic contact layer; and
    forming a corrosion protection layer.

4. The method of claim 3, wherein the ohmic contact layer comprises an alloy based on platinum-aurum, platinum-rhodium, nickel-aurum oxide, or indium-tin oxide.

5. The method of claim 3, wherein the ohmic contact layer comprises translucent material based on nickel-aurum oxide, indium-tin oxide, or a combination of nickel-aurum oxide and indium-tin oxide.

6. The method of claim 3, wherein the corrosion protection layer comprises aurum, platinum, palladium, rhodium, or stainless steel.

7. The method of claim 1, wherein the metal substrate layers are of different materials suitable for selective etching.

8. The method of claim 1, wherein removing the growth substrate comprises chemical etching.

9. The method of claim 1, further comprising roughening the surface of the n-type layer.

10. A light-emitting diode, comprising:
- an InGaAlN multilayer structure comprising a p-type layer, a multi-quantum-well layer, and an n-type layer;
- a first electrode deposited adjacent to the n-type layer;
- a second electrode deposited adjacent to the p-type layer;
- one or more metal substrate layers deposited adjacent to the p-type layer, wherein the metal substrate layers comprise a silver layer sandwiched between two copper layers; and
- a passivation layer deposited on sidewalls of the InGaAlN multiplayer structure;
- wherein the first and second electrodes form a vertical-electrode configuration.

11. The light-emitting diode of claim 10, further comprising:
- an ohmic contact layer adjacent to the p-type layer; and
- a corrosion protection layer to protect the metal substrate layers from a wet etching process used to remove a growth substrate.

12. The light-emitting diode of claim 11, the ohmic contact layer comprises an alloy based on platinum-aurum, platinum-rhodium, nickel-aurum oxide, or indium-tin oxide.

13. The light-emitting diode of claim 11, wherein the ohmic contact layer comprises translucent material based on nickel-aurum oxide, indium-tin oxide, or a combination of nickel-aurum oxide and indium-tin oxide.

14. The light-emitting diode of claim 11, wherein the corrosion protection layer comprises aurum, platinum, palladium, rhodium, or stainless steel.

15. The light-emitting diode of claim 10, wherein the metal substrate layers are of different materials suitable for selective etching.

16. The light-emitting diode of claim 10, further comprising roughening the surface of the n-type layer.

* * * * *